United States Patent
Yeh et al.

(10) Patent No.: US 9,831,197 B1
(45) Date of Patent: Nov. 28, 2017

(54) WAFER-LEVEL PACKAGE WITH METAL SHIELDING STRUCTURE AND THE MANUFACTURING METHOD THEREOF

(71) Applicant: SIGURD MICROELECTRONICS CORP., Shih-Chu (TW)

(72) Inventors: Tsan-Lien Yeh, Shih-Chu (TW); Kuan-Tien Shen, Shih-Chu (TW); Szu-Chuan Pang, Shih-Chu (TW); Wei-Ping Wang, Shih-Chu (TW)

(73) Assignee: Sigurd Microelectronics Corp., Shin-Chu (TW)

( * ) Notice: Subject to any disclaimer, the term of this patent is extended or adjusted under 35 U.S.C. 154(b) by 0 days.

(21) Appl. No.: 15/422,727

(22) Filed: Feb. 2, 2017

(51) Int. Cl.
*H01L 23/552* (2006.01)
*H01L 23/60* (2006.01)
*H01L 23/00* (2006.01)
*H01L 23/31* (2006.01)
*H01L 23/29* (2006.01)
*H01L 21/3205* (2006.01)

(52) U.S. Cl.
CPC ........ *H01L 23/60* (2013.01); *H01L 21/32051* (2013.01); *H01L 23/293* (2013.01); *H01L 23/3114* (2013.01); *H01L 24/11* (2013.01); *H01L 24/17* (2013.01)

(58) Field of Classification Search
USPC .......... 257/100, 433, 667, 787–796, 257/E31.117–E31.118, E51.02, 257/E23.116–E23.14, 625, 676, 779–783, 257/784, 785, 738, 772; 438/15, 25, 26, 438/51, 55, 64, 112, 124, 126, 127, 118, 438/406, 455–459, 615–617
See application file for complete search history.

(56) References Cited

U.S. PATENT DOCUMENTS

| | | | |
|---|---|---|---|
| 6,865,084 B2* | 3/2005 | Lin | H01L 23/3128 165/80.2 |
| 7,405,477 B1* | 7/2008 | Tao | H01L 23/49838 257/659 |
| 8,946,886 B1* | 2/2015 | Fuentes | H01L 23/36 257/678 |
| 9,673,150 B2* | 6/2017 | Gong | H01L 23/552 |
| 9,721,905 B2* | 8/2017 | Yamada | H01L 23/552 |
| 2006/0091509 A1* | 5/2006 | Zhao | H01L 23/04 257/678 |
| 2012/0243191 A1 | 9/2012 | Wu | |

(Continued)

*Primary Examiner* — Tram H Nguyen
(74) *Attorney, Agent, or Firm* — Rosenberg, Klein & Lee

(57) ABSTRACT

Provided is a wafer-level package with metal shielding structure and the manufacturing method for producing the same. The wafer-level package includes first conductive structures for securing a die unit to a substrate, and is featured by disposing one or more second conductive structures that are located at the front surface of the die unit and proximate to a side surface of the die unit. The second conductive structure does not electrically connected to the internal circuitry of the die unit. After the wafer is cut, a metal shielding layer is formed on the back surface and the side surfaces of the die unit. Afterwards, the die unit is mounted on the substrate to allow the second conductive structure to connect to the ground structure on the substrate and connect to the metal shielding layer. Thus, EMI shielding function is generated to efficiently suppress EMI and miniaturize the package.

12 Claims, 5 Drawing Sheets

(56) References Cited

U.S. PATENT DOCUMENTS

2013/0214396 A1* 8/2013 Kim .................. H01L 23/552
                                                    257/659
2014/0361387 A1* 12/2014 Meyer ................ H01L 24/19
                                                    257/415

* cited by examiner

WAFER-LEVEL PACKAGE WITH METAL SHIELDING STRUCTURE AND THE MANUFACTURING METHOD THEREOF

BACKGROUND OF THE INVENTION

Field of the Invention

The invention is related to a wafer-level chip scale package (WLCSP), and more particularly to a wafer-level package with EMI shielding effect and miniaturized volume.

Description of the Prior Art

The contemporary wafer-level chip scale package (WLCSP) is generally provided with the design of electromagnetic interference (EMI) shielding structure. The WLCSP is characterized by coating active elements and passive elements with plastic materials by the die casting process, and coating each single die with a metal shielding structure that is formed by the sputtering process. The metal shielding structure is then connected to a ground portion to accomplish an EMI shielding architecture. Such EMI shielding technique is disadvantageous in terms of increased product size and thickness. Thus, the contemporary EMI shielding technique used in WLCSP is inadequate for miniaturized 3C products.

To follow the trend of miniaturization, some EMI shielding techniques featuring excellent feasibility for wearable devices have been proposed. In particular, US Patent Publication No. US20120243191A1 serves as an example to illustrate the state-of-the-art of the invention. FIG. 1 shows the architecture of a miniaturized electromagnetic interference shielding structure of U.S. Patent Publication No. US20120243191A1. In FIG. 1, a substrate 1 is provided, and a plurality of conductive bumps 3 are formed on the substrate 1 and are electrically connected to ground portions 6 on the substrate 1. The conductive bumps 3 are proximate to the die units 2. After the die units 2 are formed, the die units 2 and the conductive bumps 3 are covered with an encapsulating unit. The encapsulating units are cut off to form a plurality of encapsulating plastic layers 4, each of which is covered on a die unit 2. Each conductive bump 3 has an exposed surface through the side portion of the encapsulating plastic layers 4. An EMI shielding layer 5 is then covered on the surface of the encapsulating plastic layers 4 and the exposed surface of the conductive bumps 3, such that the EMI shielding layer 5 is able to be electrically connected to the ground portions 6 through the conductive bumps 3.

However, the aforementioned patent requires additional conductive bumps that are disposed proximately to the die unit 2 to electrically connect the EMI shielding layer 5 to the ground portions 6, thereby accomplishing an EMI shielding structure. Therefore, after the redistribution and bumping process are completed, the conductive bumps 3 must be additionally formed during the mounting process. Afterwards, the cutting process and the packaging process may be carried out. Finally, the EMI shielding layer 5 is covered on the encapsulating plastic layers 4 for the purpose of providing EMI shielding function. This would limit the flexibility of process and complicate the manufacturing procedure. In addition, this would degrade the yield of the die unit and increase the manufacturing cost and product cycle. More disadvantageously, the overall size of the packaging structure is aggrandized, as the additional conductive bumps 3 are disposed outside of the periphery of the die units 2.

In view of the drawbacks encountered by the prior art, the invention proposes a wafer-level package with metal shielding structure that can be manufactured with a simplified process and result in a miniaturized volume. Also, the invention is able to conquer the drawbacks encountered by the prior art with a packaging configuration and manufacturing process different from the prior art.

SUMMARY OF THE INVENTION

An object of the invention is to provide a wafer-level package with metal shielding structure and the manufacturing method thereof. The invention is featured by using a second conductive structure disposed in the die unit and proximately to a side surface of the die unit to electrically connect to a metal shielding layer that will be manufactured in the subsequent process. After the die unit is mounted on the board, the metal shielding layer can be directly electrically connected to the ground to achieve EMI shielding function.

Another object of the invention is to provide a manufacturing method for a wafer-level package with metal shielding structure. The inventive method is featured by a simplified manufacturing process and is adequate for manufacturing miniaturized products.

To this end, the invention discloses a wafer-level package with metal shielding structure. The inventive wafer-level package with metal shielding structure includes a substrate, at least one die unit, a plurality of first conductive structures, at least one second conductive structure, an encapsulating plastic layer, and a metal shielding layer. The substrate includes at least one ground portion and the die unit is mounted on the substrate. The first conductive structures are mounted on the substrate and located at the front surface of the die unit for securing the die unit to the substrate. The second conductive structure is disposed on the substrate and is located at the front surface of the die unit and proximate to one side surface of the die unit. The second conductive structure is electrically connected to the ground portion on the substrate. The encapsulating plastic layer covers the back surface and all the side surfaces of the die unit, and the metal shielding layer covers the encapsulating plastic layer and extends to the second conductive layer. Thus, the metal shielding layer is electrically connected to the ground portion to serve as a metal shielding structure.

Also, the invention discloses a manufacturing method for a wafer-level package with metal shielding structure. The manufacturing method according to the invention includes the steps of: providing a substrate having at least one ground portion; providing a plurality of die units, each of which includes a plurality of first conductive structures on a front surface of the die unit and at least one second conductive structure being proximate to one side surface of the die unit; covering the die units with an encapsulating unit and cutting off the encapsulating unit into a plurality of encapsulating plastic layers that cover the back surface and all the side surfaces of the die unit; forming a metal shielding layer that is covered on the encapsulating plastic layer and extends to the second conductive structure; and mounting the die units on the substrate to allow each die unit to secure to the substrate through the first conductive structure and allow the metal shielding layer to electrically connect to the ground through the second conductive structure, thereby achieving EMI shielding function.

Now the foregoing and other features and advantages of the invention will be best understood through the following descriptions with reference to the accompanying drawings, in which:

DESCRIPTION OF THE PREFERRED EMBODIMENTS

Figure 1:
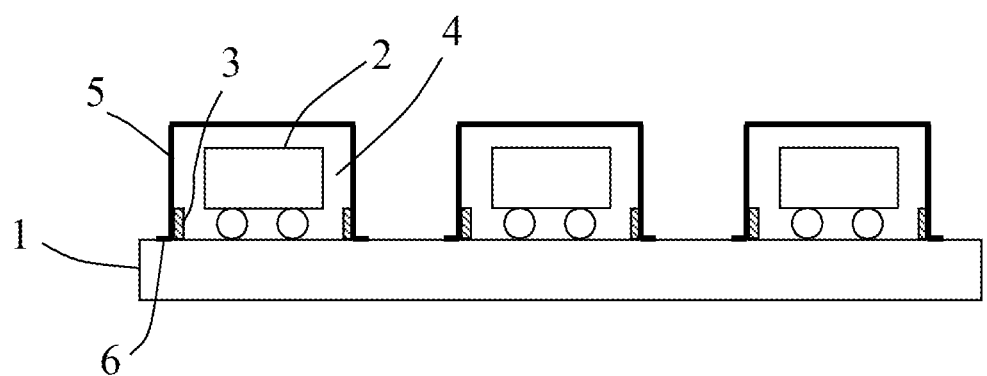
FIG. 1 shows a cross-sectional view of a miniaturized EMI shielding structure according to the prior art.
Figure 2:
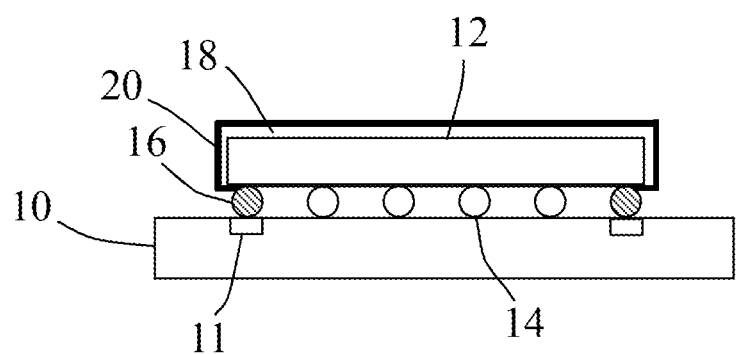
FIG. 2 shows a cross-sectional view of a wafer-level package with metal shielding structure according to a preferred embodiment of the invention.

Referring to FIG. 2, a cross-sectional view of a wafer-level package with a metal shielding structure according to a preferred embodiment of the invention is shown. The wafer-level package of the invention includes a substrate 10, a die unit 12, a plurality of first conductive structure 14, at least one second conductive structure 16, an encapsulating plastic layer 18, and a metal shielding layer 20.

The substrate 10 may be a printed circuit board or a silicon wafer substrate. A multiplicity of ground portions 11 are disposed on the substrate 10. The die unit 12 is disposed on the substrate 10 and may be configured in a fan-in package or a fan-out package. Here, the lower surface of the die unit 12 is defined as the front surface and the upper surface of the die unit 12 is defined as the back surface, and the periphery of the die unit 12 is defined as the side surface. The first conductive structure 14 includes circuit traces electrically connecting to the die unit 12. By way of the coupling of the first conductive structure 14, the die unit 12 can be electrically connected to the substrate 10 through the first conductive structure 14. The first conductive structure 14 can be formed of metal and can be configured as a solder ball, a solder bump, or a solder post. The second conductive structure 16 is disposed on the substrate 10 and is located on the front surface of the die unit 12, and is proximate to one side surface of the die unit 12. The second conductive structure 16 is not coupled to the internal circuitry of the die unit 12. Instead, the second conductive structure 16 is connected to the ground portion 11 on the substrate 10. The second conductive structure 16 is formed of a metallic material and is configured as a solder ball, a solder bump, or a solder post.

The encapsulating plastic layer 18 is set to cover the back surface and all the side surfaces of the die unit 12. The metal shielding layer 20 is set to cover the upper surface and the one side surface of the encapsulating plastic layer 18 and extend to the second conductive structure 16. In this way, the metal shielding layer 20 is electrically connected to the ground portion 11 on the substrate 10 through the second conductive structure 16 so as to achieve the EMI shielding effect.

Figure 3:
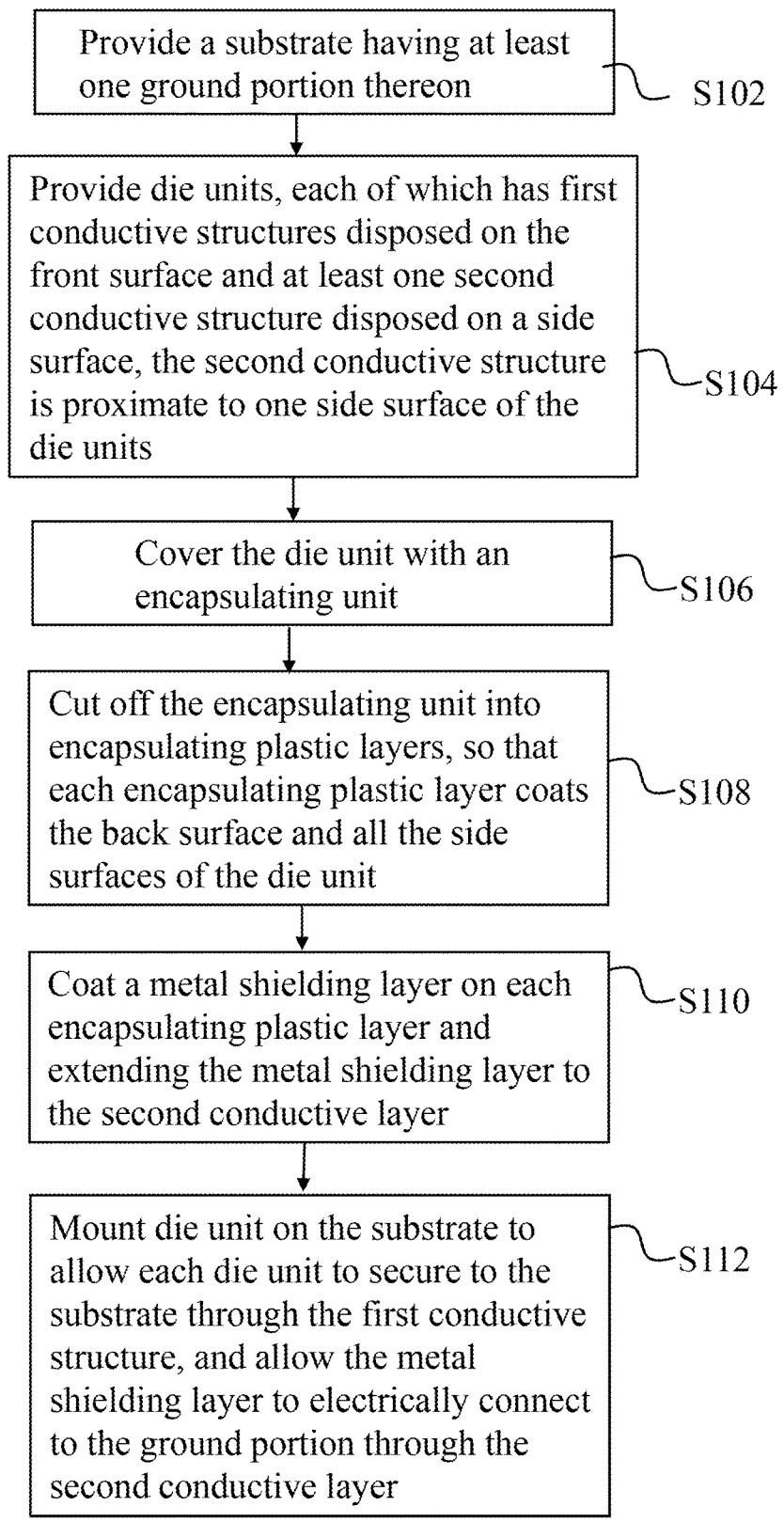
FIG. 3 is a flow chart showing the manufacturing process of a wafer-level package with metal shielding structure according to the invention.
Figure 4A:
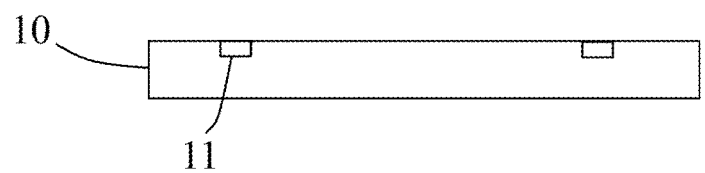
FIG. 4A to FIG. 4F are cross-sectional views for illustrating the manufacturing process of a wafer-level package with metal shielding structure according to the invention.

Next, please refer to FIG. 3. FIG. 3 shows the flow chart illustrating the manufacturing process of the wafer-level package with metal shielding structure according to the invention. In the meantime, FIGS. 4A-4F show cross-sectional views for illustrating the manufacturing steps of the wafer-level package with metal shielding structure according to the invention. The manufacturing process according to the invention includes the following steps:

Firstly, the process starts with step S102. As shown in FIG. 4A, a substrate 10 is provided, which includes a ground portion 11.

Figure 4B:
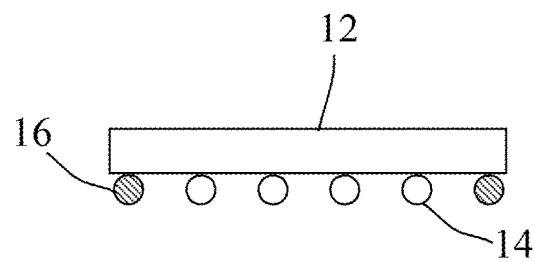

Secondly, the process continues with step S104. As shown in FIG. 4B, a die unit 12 is provided. A plurality of first conductive structures 14 and second conductive structures 16 are formed on the front surface of the die unit 12. The second conductive structures 16 are located proximately to one side surface of the die unit 12. In other words, the second conductive structures are located outside of the front surface of the die unit 12.

Figure 4C:
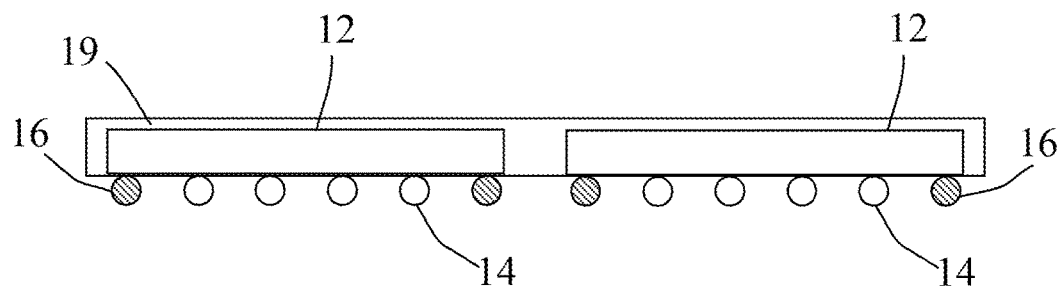

Afterwards, the process continues with step S106. As shown in FIG. 4C, an encapsulating unit 19 is formed of plastic material by the injection molding process. The encapsulating unit 19 is set to cover the die units 12 except the first conductive structure 14 and the second conductive structure 16 of each die unit 12.

Figure 4D:
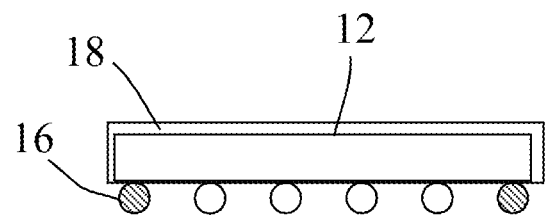

Next, the process continues with step S108. As shown in FIG. 4D, the wafer is cut off so that the encapsulating unit 19 is cut into a plurality of encapsulating plastic layers 18, each of which is set to cover the back surface and all the side surfaces of a die unit 12.

Figure 4E:
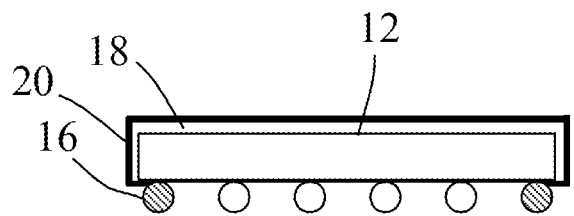

Next, the process continues with step S110. As shown in FIG. 4E, a metallic material is used to form a metal shielding layer 20 by a metal plating process. This metal shielding layer 20 is set to cover the upper surface and the side surfaces of the encapsulating plastic layers 18 and extend to the second conductive structure 16, thereby forming electrical connections. In this step, the metal plating process could be, for example, the metal sputtering process. However, the metal plating process can be achieved by other metal plating method. In practice, the metal shielding layer 20 can be formed by covering a metal film on the encapsulating plastic layer 18.

Figure 4F:
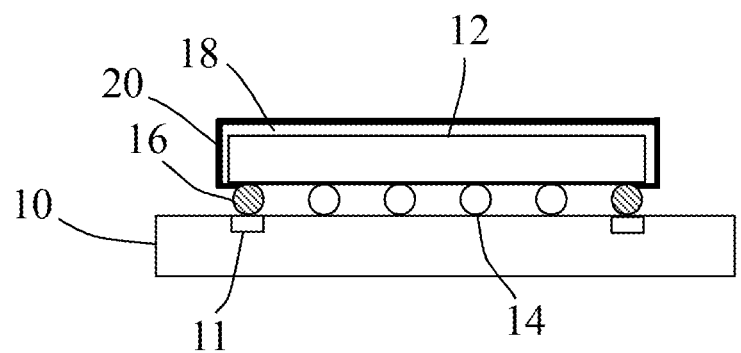

Finally, the process continues with step S112. As shown in FIG. 4F, the die unit 12 can be secured to the substrate 10 by for the subsequent assembling process, such as SMT process, POP (package on package) process, or stacking process. As the die unit 12 is mounted on the substrate 10, the first conductive structure 14 is electrically connected to the substrate 10 and the second conductive structure 16 is electrically connected to the ground portion 11 on the substrate 10. The metal shielding layer 20 is electrically connected to the ground portion 11 on the substrate 10 through the conducting second conduction structure 16, thereby attaining EMI shielding effect. \

In conclusion, the inventive wafer-level package with metal shielding structure and the manufacturing method for manufacturing the same is characterized in that a second conductive structure is mounted at the front surface of the die unit during the redistribution and bumping process. The second conductive structure is proximate to one side surface of the die unit and is not electrically connected with the internal circuitry of the die unit. Afterwards, a metal shielding layer is formed on the back surface and all the side surfaces of the die unit and is connected to the second conductive structure. When the die unit is mounted on the substrate, the second conductive layer is electrically connected to the ground structure on the substrate, and the metal shielding layer is electrically connected to ground through the ground structure. Thus, the goal of EMI shielding is accomplished.

Compared to the prior art, the inventive wafer-level package with metal shielding structure utilizes the spare space within the die unit to dispose a second conductive structure after the die unit is secured to the substrate through the first conductive structure (i.e. bump). In this way, the invention does not require additional space to dispose bumps so as to downsize the volume of the package to a minimum level. Also, the second conductive structure can be formed coherently with the redistribution and bumping process by a simplified process. Thus, the invention is able to promote yield and reduce production cycles, and lower manufacturing cost and enhance manufacturing efficiency.

While the invention has been described in terms of what are presently considered to be the most practical and preferred embodiments, it is to be understood that the invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the invention which is defined by the appended claims.

What is claimed is:

1. A wafer-level package with metal shielding structure, comprising:
    a substrate having a front surface, a back surface and a plurality of side surfaces, at least one ground portion on the back surface;
    at least one die unit mounted on the substrate;
    a plurality of first conductive structures mounted on the substrate and located at the front surface of the die unit for electronically connecting the die unit to the substrate;
    at least one second conductive structure mounted on the substrate and located at the front surface of the die unit and proximate to one of the side surfaces of the die unit for electronically connecting to the ground portion;
    an encapsulating plastic layer covering the back surface and the side surfaces of the die unit; and
    a metal shielding layer covering the encapsulating plastic layer and extending to the second conductive structure for electrically connecting to the ground portion on the substrate.

2. The wafer-level package with metal shielding structure according to claim 1, wherein the substrate is a printed circuit board or a silicon wafer substrate.

3. The wafer-level package with metal shielding structure according to claim 1, wherein the metal shielding layer is formed by a sputtering process.

4. The wafer-level package with metal shielding structure according to claim 1, wherein the first conducive layer comprises solder balls, solder bumps, or solder posts.

5. The wafer-level package with metal shielding structure according to claim 1, wherein the second conducive layer comprises solder balls, solder bumps, or solder posts.

6. The wafer-level package with metal shielding structure according to claim 1, wherein the die unit is configured in a fan-in package or a fan-out package.

7. A manufacturing method for a wafer-level package, comprising the steps of:
    providing a substrate having a front surface, a back surface and a plurality of side surfaces, at least one ground portion on the back surface;
    providing a plurality of die units, each of which includes a plurality of first conductive structures and at least one second conductive structure disposed at the front surface of the die unit, and wherein the second conductive structure is proximate to one of the side surfaces of the die unit;
    covering the die unit with an encapsulating unit;
    cutting off the encapsulating unit into a plurality of encapsulating plastic layers to allow each encapsulating plastic layer to cover the back surface and the side surfaces of the die unit;
    covering the encapsulating plastic layer with a metal shielding layer and allowing the metal shielding layer to extend to the second conductive structure; and
    mounting the die unit on the substrate and allowing the die unit to electrically connect to the substrate through the first conductive structure, and allowing the metal shielding layer to electrically connect to the ground portion through the second conductive layer.

8. The manufacturing method according to claim 7, wherein the substrate is a printed circuit board or a silicon wafer substrate.

9. The manufacturing method according to claim 7, wherein the metal shielding layer is formed by a sputtering process.

10. The manufacturing method according to claim 7, wherein the first conducive layer comprises solder balls, solder bumps, or solder posts.

11. The manufacturing method according to claim 7, wherein the second conducive layer comprises solder balls, solder bumps, or solder posts.

12. The manufacturing method according to claim 7, wherein the die unit is configured in a fan-in package or a fan-out package.

* * * * *